US011196386B2

(12) United States Patent
Jia et al.

(10) Patent No.: US 11,196,386 B2
(45) Date of Patent: Dec. 7, 2021

(54) OPERATION AMPLIFICATION CIRCUIT AND OVER-CURRENT PROTECTION METHOD THEREFOR

(71) Applicant: Chipone Technology (Beijing) Co., Ltd., Beijing (CN)

(72) Inventors: Youping Jia, Beijing (CN); Zhiqiang Cheng, Beijing (CN)

(73) Assignee: CHIPONE TECHNOLOGY (BEIJING) CO., LTD, Beijing (CN)

( * ) Notice: Subject to any disclaimer, the term of this patent is extended or adjusted under 35 U.S.C. 154(b) by 131 days.

(21) Appl. No.: 16/628,015

(22) PCT Filed: Oct. 16, 2018

(86) PCT No.: PCT/CN2018/110481
§ 371 (c)(1),
(2) Date: Dec. 31, 2019

(87) PCT Pub. No.: WO2019/227822
PCT Pub. Date: Dec. 5, 2019

(65) Prior Publication Data
US 2020/0220498 A1   Jul. 9, 2020

(30) Foreign Application Priority Data

May 31, 2018 (CN) .......................... 201810549487.7

(51) Int. Cl.
*H03F 1/52* (2006.01)
*H03F 1/02* (2006.01)
(Continued)

(52) U.S. Cl.
CPC ............. *H03F 1/0211* (2013.01); *H02H 9/02* (2013.01); *H03F 1/301* (2013.01); *H03F 3/16* (2013.01)

(58) Field of Classification Search
CPC .......... H03F 1/0211; H03F 1/301; H03F 3/16; H03F 2200/447; H03F 2200/468;
(Continued)

(56) References Cited

U.S. PATENT DOCUMENTS 3,968,382 A * 7/1976 Tsurushima ............. G01H 1/04
361/87
5,450,019 A * 9/1995 McClure .......... H03K 19/00361
326/121

(Continued)

FOREIGN PATENT DOCUMENTS

CN            101488711          7/2009
CN            101592967          12/2009
(Continued)

*Primary Examiner* — Khanh V Nguyen
(74) *Attorney, Agent, or Firm* — Treasure IP Group, LLC (57) ABSTRACT

Disclosed is an operation amplification circuit and an over-current protection method therefor. The operation amplification circuit comprises: a control unit, configured to generate an output control signal according to an input signal and an output signal; an output unit, configured to generate an output current under control of the output control signal, wherein the output unit comprises an output capacitor which is charged or discharged by the output current to generate the output signal; an over-current protection unit, obtaining a temperature control current according to an operating temperature of the operation amplification circuit, wherein when the operating temperature is greater than or equal to a predetermined temperature, the temperature control current is positively correlated with the operating temperature, and the over-current protection unit adjusts the output control signal according to the temperature control current to limit the output current.

15 Claims, 3 Drawing Sheets

(51) Int. Cl.
*H02H 9/02* (2006.01)
*H03F 1/30* (2006.01)
*H03F 3/16* (2006.01)

(58) Field of Classification Search
CPC ......... H03F 2200/474; H03F 2200/297; H03F 1/308; H03F 1/523; H03F 3/45475; H03F 1/52; H03F 3/217; H03F 2200/78; H02H 9/02; H02H 9/025; H03G 3/3042
USPC .............................................. 330/207 P, 298
See application file for complete search history.

(56) References Cited

U.S. PATENT DOCUMENTS

| | | | | |
|---|---|---|---|---|
| 7,123,045 B2* | 10/2006 | Doi | ......................... | H03F 1/523 |
| | | | | 326/23 |
| 7,154,332 B2* | 12/2006 | Tsuchi | .................. | H03F 3/3022 |
| | | | | 330/255 |
| 7,486,936 B2* | 2/2009 | Kappes | ................... | H03F 1/523 |
| | | | | 327/321 |
| 7,649,414 B2* | 1/2010 | Kaya | ....................... | H03F 3/217 |
| | | | | 330/251 |
| 7,705,673 B2* | 4/2010 | Teng | ...................... | H03F 3/2173 |
| | | | | 330/207 P |
| 8,872,561 B2* | 10/2014 | Shen | ...................... | H03K 17/133 |
| | | | | 327/170 |
| 9,742,399 B2* | 8/2017 | Shen | ....................... | H03F 3/217 |
| 9,837,967 B2* | 12/2017 | Su | ......................... | H03F 1/083 |
| 10,367,459 B2* | 7/2019 | Koyama | ................ | H03F 3/187 |
| 2013/0314835 A1 | 11/2013 | Tseng | | |
| 2015/0295544 A1 | 10/2015 | Su et al. | | |

FOREIGN PATENT DOCUMENTS

| | | |
|---|---|---|
| CN | 102566633 | 7/2012 |
| CN | 208190606 | 12/2018 |
| CN | 209299135 A | 8/2019 |

\* cited by examiner

- Prior Art -

OPERATION AMPLIFICATION CIRCUIT AND OVER-CURRENT PROTECTION METHOD THEREFOR

CROSS-REFERENCE TO RELATED APPLICATIONS

The present application claims the priority of the Chinese invention application whose application date is Thursday, May 31, 2018, application number 201810549487.7, and the title is "Operation Amplification Circuit And Over-current Protection Method Therefor", which is cited to the present application by referring to the entire specification, claims, drawings and abstract of the above-mentioned Chinese invention application.

BACKGROUND OF THE DISCLOSURE

Field of Technology

The disclosure relates to the field of electronic circuit technology, in particular, to an operation amplification circuit and an over-current protection method therefor.

Description of the Related Art

In many applications, Operational amplifier (OPA) is required to drive a large load capacitor. The capacitance of the load capacitor is typically a few microfarads to more than a dozen microfarads.

Figure 1:
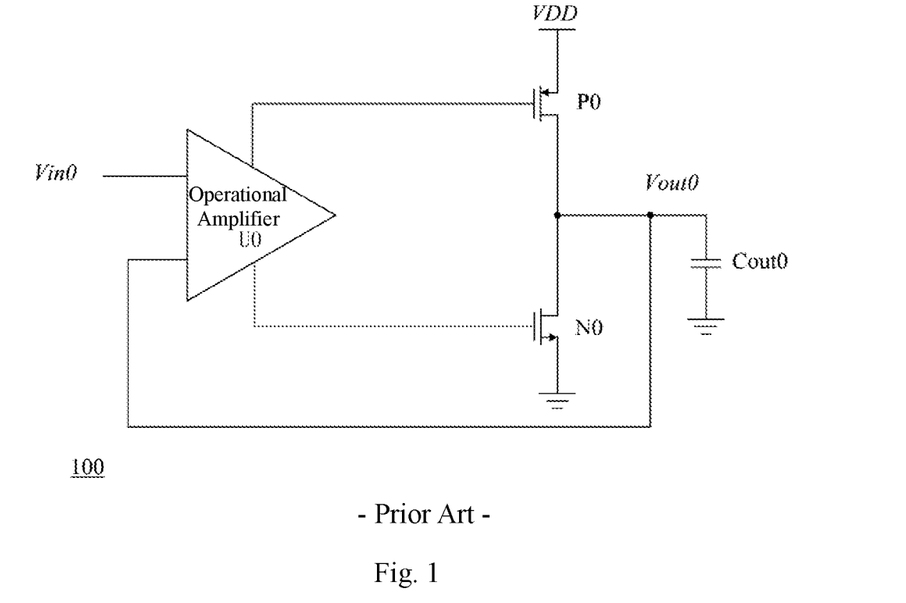
FIG. 1 illustrates an operation amplification circuit in the prior art.

FIG. 1 illustrates an operation amplification circuit 100 according to the prior art, wherein the operational amplifier U0 generates an output control signal according to an input signal Vin0 and a feedback output signal Vout0, and the output control signal controls transistor P0 or transistor N0, so that the output capacitor Cout0 is constantly charged and discharged by an output current Iout0 provided by a pull-up transistor or a pull-down transistor, thereby providing an output voltage Vout0 on its upper electrode plate.

Generally, in an OPA, the input signal Vin0 is usually a high/low level signal, and a high power supply voltage VDD is generally large (a dozen volts to twenty volts). If the operation amplification circuit does not have an over-current protection mechanism, the power consumption may be high when the frequency of the input signal is high, causing an operating temperature of the operation amplification circuit to be too high, and even the chip in which the operation amplification circuit is located to be burned out.

For this situation, various design methods have been proposed in the industry at present to avoid the operating temperature of the operation amplification circuit being too high.

The first prior art is to control the operating temperature by detecting the gate-to-source voltages of the transistors P0 and N0. Specifically, when an absolute value of the gate-source voltage of the transistor P0 or the gate-source voltage of the transistor N0 rises to a certain value, the gate-source voltages of the transistors P0 and N0 are limited to set values, so that the on currents generated by the transistors P0 and N0 are limited. This method has the disadvantage of limiting the degree of conduction of the transistors P0 and N0 when the gate-source voltages of the transistors P0 and N0 reach a certain value regardless of how high a power supply voltage VDD is set However, in case that the high power supply voltage VDD is small, the on currents of the transistors P0 and N0 are limited when the gate-to-source voltage reaches a certain value even if the operating temperature and the circuit power consumption are not high, so that the output efficiency, the response speed, and the drive capability of the operation amplification circuit are reduced.

The second prior art is to further control the output current according to the value of the high power supply voltage VDD based on the first prior art. Specifically, when the high power supply voltage VDD is low, the gate-source voltages of the transistors P0 and N0 are not limited; when the high power supply voltage VDD is high, the gate-source voltages of the transistors P0 and N0 are limited to achieve the purpose of limiting the output current, so that the operating temperature of the operation amplification circuit does not rise any more. However, the prior art has a disadvantage of not being able to control the magnitude of the output current based on the frequency of the input signal, wherein when the frequency of the input signal is low, even if the high power supply voltage VDD is high and the gate-source voltages of the transistors P0 and N0 are high, the power consumption and operating temperature of the operation amplification circuit are not too high, so it is unnecessary to limit the gate-source voltages of the transistors P0 and N0 at this time; moreover, if the frequency of the input signal is high, the power consumption and operating temperature of the operation amplification circuit may increase even if the gate-source voltages of the transistors P0 and N0 are limited.

Therefore, in order to solve problems related to the operating temperature of the operation amplification circuit, the prior art has certain limitations.

SUMMARY OF THE DISCLOSURE

To solve problems in the above prior art, in the disclosure, the temperature control current is obtained by detecting the operating temperature of the operation amplification circuit, so that an output efficiency, a response speed and a drive capability of the operation amplification circuit are ensured when the operating temperature is within a reasonable range, and the output current is limited according to the temperature control current to reduce the circuit power consumption and operating temperature when the operating temperature is too high.

According to an aspect of the disclosure, an operation amplification circuit is provided, comprising: a control unit, configured to generate an output control signal according to an input signal and an output signal; an output unit, configured to generate an output current under control of the output control signal, wherein the output unit comprises an output capacitor which is charged or discharged by the output current to generate the output signal; an over-current protection unit, configured to obtain a temperature control current according to an operating temperature of the operation amplification circuit, wherein when the operating temperature is greater than or equal to a predetermined temperature, the temperature control current is positively correlated with the operating temperature, and the over-current protection unit adjusts the output control signal according to the temperature control current to limit the output current.

Preferably, the control unit comprises an operational amplifier; a first input terminal and a second input terminal of the operational amplifier respectively receive the input signal and the output signal, and an output terminal of the operational amplifier provides the output control signal.

Preferably, when the operating temperature is less than or equal to the predetermined temperature, the temperature control current is approximately 0; when the operating temperature is greater than or equal to the predetermined temperature, the temperature control current is linear with the operating temperature.

Preferably, the output control signal comprises a first control signal and a second control signal; the output unit further comprises a first transistor having a P channel and a second transistor having an N channel which are sequentially connected in series between a high power supply voltage and a low power supply voltage, the first transistor and the second transistor are respectively controlled by the first control signal and the second control signal, and the first transistor or the second transistor is turned on to generate the output current.

Preferably, the over-current protection unit comprises: a third transistor, having a first terminal receiving the high power supply voltage, a second terminal connected to the control terminal of the first transistor, and a control terminal receiving a first sampling voltage; a fourth transistor, having a first terminal receiving the low power supply voltage, a second terminal connected to the control terminal of the second transistor, and a control terminal receiving a second sampling voltage; and a voltage generating module, generating the first sampling voltage and the second sampling voltage according to the temperature control current, wherein when the temperature control current is greater than or equal to a set threshold and the first control signal is active, the third transistor is turned on by the first sampling voltage, and when the temperature control current is greater than or equal to the set threshold and the second control signal is active, the fourth transistor is turned on by the second sampling voltage.

Preferably, the temperature control current comprises a first temperature control current and a second temperature control current, and the voltage generating module comprises: a first current source, providing the first temperature control current according to the operating temperature, and converting a difference current between a first reference current and the first temperature control current into the first sampling current by a current mirror structure; a second current source, providing the second temperature control current according to the operating temperature, and converting a difference current between a second reference current and the second temperature control current into the second sampling current by the current mirror structure; a first resistor, providing the first sampling voltage at the control terminal of the third transistor according to the first sampling current; and a second resistor, providing the second sampling voltage at the control terminal of the fourth transistor according to the second sampling current.

Preferably, the third transistor comprises an N-channel field effect transistor (FET), and a first terminal of the first resistor receives the high power supply voltage; a second terminal of the first resistor is connected to the control terminal of the third transistor, and the first sampling current flows from the first terminal of the first resistor to the second terminal; the fourth transistor comprises a P-channel field effect transistor (FET), and a first terminal of the second resistor receives the low power supply voltage; a second terminal of the second resistor is connected to the control terminal of the fourth transistor, and the first sampling current flows from the second terminal of the second resistor to the first terminal.

Preferably, the first temperature control current is equal to the second temperature control current, the first reference current is equal to the second reference current, and the current mirror structure in the first current source has an equal scale factor with the current mirror structure in the second current source.

Preferably, the high power supply voltage is less than or equal to a product of the first temperature control current, the scale factor, and a resistance of the first resistor.

According to another aspect of the disclosure, an over-current protection method for an operation amplification circuit is provided, the operation amplification circuit including a control unit and an output unit, the control unit generating an output control signal according to the input signal and the output signal, the output unit generating an output current according to the output control signal and accumulates or releases a charge under control of the output current to generate the output signal, wherein the method comprises: detecting an operating temperature of the operation amplification circuit; obtaining a temperature control current according to the operating temperature, wherein when the operating temperature is greater than or equal to a predetermined temperature, the temperature control current is positively correlated with the operating temperature; and adjusting the output control signal according to the temperature control current to limit the output current.

Preferably, setting the temperature control current to be approximately 0 when the operating temperature is less than or equal to the predetermined temperature; setting the temperature control current to be linear with the operating temperature when the operating temperature is greater than or equal to the predetermined temperature.

Preferably, the output control signal comprises a first control signal and a second control signal; the output unit comprises a first transistor having a P channel and a second transistor having an N channel which are sequentially connected in series between a high power supply voltage and a low power supply voltage, the first transistor and the second transistor are respectively controlled by the first control signal and the second control signal, and the first transistor or the second transistor is turned on to generate the output current.

Preferably, the method of adjusting the output control signal according to the temperature control current to limit the output current comprises: generating a first sampling voltage and a second sampling voltage according to the temperature control current; providing a pull-up path at a control terminal of the first transistor, wherein when the temperature control current is greater than or equal to a set threshold and the first control signal is active, the first sampling voltage turns on the pull-up path; and providing a pull-down path at the control terminal of the second transistor, wherein when the temperature control current is greater than or equal to the set threshold and the second control signal is active, the second sampling voltage turns on the pull-down path.

Preferably, the temperature control current comprises a first temperature control current and a second temperature control current, and the step of generating a first sampling voltage and a second sampling voltage according to the temperature control current comprises: providing a first reference current and a second reference current; converting a difference current between the first reference current and the first temperature control current into the first sampling current according to a first scale factor, and converting a difference current between the second reference current and the second temperature control current into the second sampling current according to a second scale factor; and providing the first sampling voltage and the second sampling voltage according to the first sampling current and the second sampling current, respectively.

Preferably, the first temperature control current is equal to the second temperature control current, the first reference current is equal to the second reference current, and the first scale factor is equal to the second scale factor.

The operation amplification circuit provided by the disclosure directly obtains the temperature control current according to the operating temperature of the operation amplification circuit, and the over-current protection unit in the operation amplification circuit limits the output current with the temperature control current if and only if the operating temperature exceeds a certain threshold, thereby reducing the power consumption of the operational amplifier, preventing the operating temperature from being too high, affecting the normal operation of the operational amplifier, and avoiding damage to the operational amplifier caused by excessive operating temperature. Meanwhile, when the operating temperature is within a reasonable range, the over-current protection unit in the operation amplification circuit does not limit the output current, thereby ensuring the output efficiency, response speed, and driving capability of the operation amplification circuit under normal operating temperature.

BRIEF DESCRIPTION OF THE DRAWINGS

The above and other objects, features and advantages of the present disclosure will become more apparent from the description below with reference to the accompanying drawings.

DESCRIPTION OF THE EMBODIMENTS

The present disclosure will be described in more detail below with reference to the accompanying drawings. In the various figures, the same elements are denoted by the similar reference numerals. For the sake of clarity, the various parts in the figures are not drawn to scale. Further, the lead wires other than the corresponding driving electrodes and the sensing electrodes are not shown in the drawings, and some well-known portions may not be shown.

Many specific details of the disclosure are described below, such as the structure, materials, dimensions, processing, and techniques of the disclosure, in order to provide a clear understanding of the disclosure. However, as will be understood by those skilled in the art, the disclosure may not be implemented in accordance with these specific details.

Figure 2:
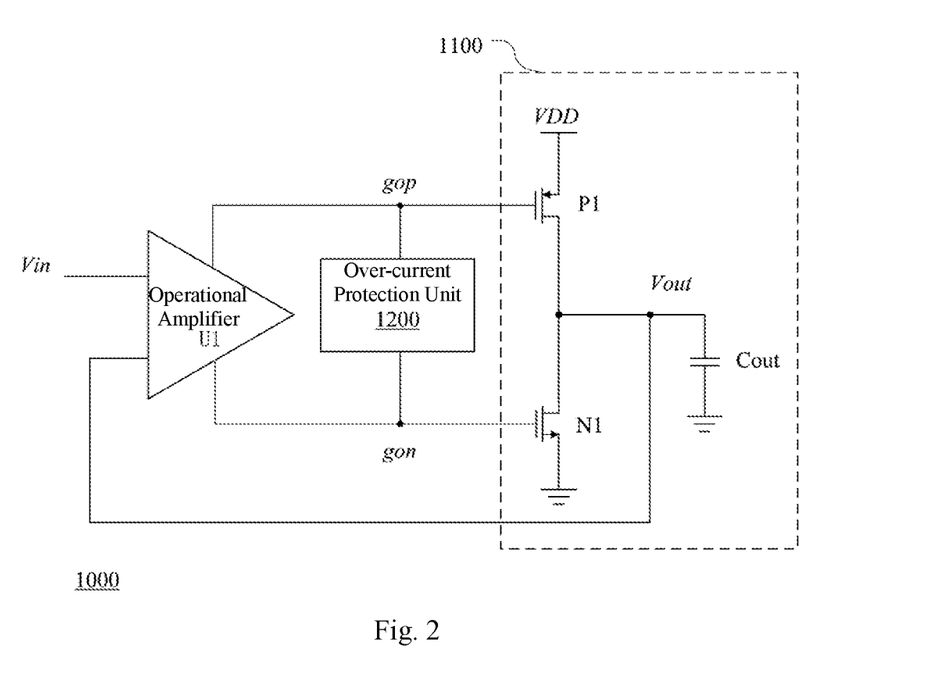
FIG. 2 illustrates a circuit diagram of an operation amplification circuit of a first embodiment of the disclosure.

FIG. 2 illustrates a circuit diagram of an operation amplification circuit of a first embodiment of the disclosure.

As shown in FIG. 2, the operation amplification circuit 1000 of the first embodiment of the disclosure comprises a control unit, an output unit 1100 and an over-current protection unit 1200. In the present embodiment, the control unit is implemented by an operational amplifier U1. However, embodiments of the disclosure are not limited thereto, and those skilled in the art may implement the control unit with other circuits to generate an output control signal according to a specific situation.

The operational amplifier U1 has a first input terminal, a second input terminal, a first output terminal, and a second output terminal, wherein the first input terminal receives an input signal Vin; the second input terminal receives an output signal Vout that is fed back by the output unit 1100; the first output terminal provides a first control signal gop; and the second output terminal provides a second control signal gon. Specifically, the operational amplifier U1 is configured to generate an output control signal according to the input signal Vin and the output signal Vout, the input signal Vin typically being a high and low level signal, and the output control signal typically comprises a first control signal gop and a second control signal gon. When the input signal Vin is a high level signal, the first control signal gop pulls up the output unit 1100; when the input signal Vin is a low level signal, the second control signal gon pulls down the output unit 1100.

The output unit 1100 is configured to generate an output current Iout under control of the output control signal, and generate an output signal Vout according to the output current Iout. Specifically, as shown in FIG. 2, the input unit 1100 comprises an output capacitor Cout, a first transistor P1 and a second transistor N1. The first transistor P1 and the second transistor N1 are sequentially connected in series between the high power supply voltage VDD and a low power supply voltage VSS, and a common node of the first transistor P1 and the second transistor N1 provides the output current Iout to a first terminal of the output capacitor Cout, so that the output capacitor Cout is continuously charged and discharged by the output current Iout to generate an output voltage Vout at its first terminal. A second terminal of the output capacitor Cout receives the low power supply voltage VSS, and the low power supply voltage VSS is, for example, a reference ground voltage. The present embodiment is described in detail as follows with examples of the first transistor P1 being a P-channel field effect transistor and the second transistor N1 being a N-channel field effect transistor. However, embodiments of the present disclosure are not limited thereto, and those skilled in the art may set the first transistor P1 and the second transistor N1 as other types of transistors according to actual needs, and make corresponding changes to other parts in the operation amplification circuit according to the same circuit principle.

In a specific operating process, the first transistor P1 and the second transistor N1 are respectively controlled by the first control signal gop and the second control signal gon, and when the first control signal gop turns on the first transistor P1 (for the present embodiment, when a gate-source voltage Vgs1 of the first transistor P1 is less than 0 and an absolute value of the gate-source voltage Vgs1 of the first transistor P1 is greater than an absolute value of a threshold voltage of the first transistor P1, the first transistor P1 is turned on, and the gate-source voltage Vgs1 of the first transistor P1 is equal to a difference between the first control signal gop and the high power supply voltage VDD), an on current of the first transistor P1, as the output current Iout, charges a first terminal of the output capacitor Cout; when the second control signal gon turns on the second transistor N1 (for the present embodiment, when a gate-source voltage Vgs2 of the second transistor N1 is greater than a threshold voltage of the second transistor N1, the second transistor N1 is turned on, and the gate-source voltage Vgs2 of the second transistor N1 is equal to a difference between the second control signal gon and the low power supply voltage VSS), an on current of the second transistor N1, as the output current Iout, discharges the first terminal of the output capacitor Cout, thereby adjusting the output voltage Vout.

In the actual operation of the operation amplification circuit, since the output capacitor Cout as a load is usually large, and a voltage value of the high power supply voltage VDD is also high (for example, a dozen volts to twenty volts), the power consumption of the operation amplification circuit is high when the frequency of the input signal Vin is high, so that the operating temperature T is high, and further the normal operation of the operation amplification circuit will be affected when the operating temperature T exceeds a certain value, so that the operational amplifier may even be damaged. Therefore, the operation amplification circuit 1000 of the first embodiment of the disclosure comprises an over-current protection unit 1200.

As shown in FIG. 2, the over-current protection unit 1200 is configured to obtain a temperature control current I_temp according to an operating temperature T of the operation amplification circuit (for example, a temperature of a chip where the operation amplification circuit is located), and adjust the output control signal according to the temperature control current I_temp to limit the output current Iout under certain conditions, thereby avoiding the normal operation of the operation amplification circuit 1000 to be affected by too high operating temperature T, and preventing the operation amplification circuit 1000 from being damaged at the higher operating temperature T.

Figure 3:
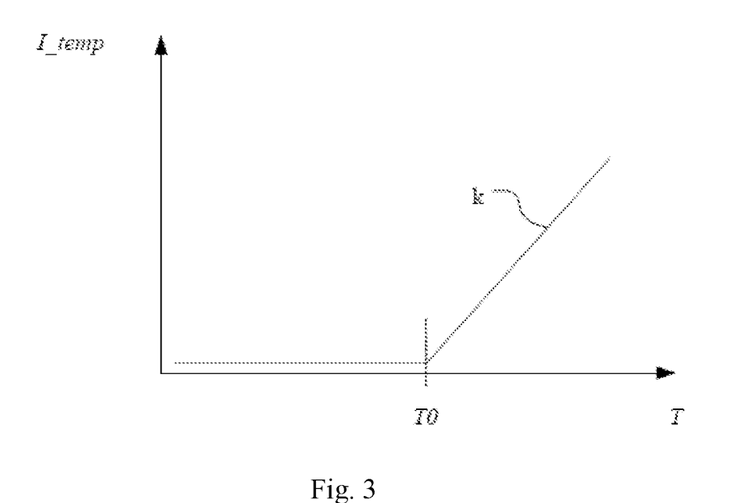
FIG. 3 is a view showing the relationship between the operating temperature and the temperature control current in the first embodiment of the present disclosure.

FIG. 3 is a view showing the relationship between the operating temperature and the temperature control current in the first embodiment of the present disclosure. Among them, the horizontal axis represents the operating temperature T and the vertical axis represents the temperature control current I_temp.

As shown in FIG. 3, when the operating temperature T is less than or equal to a predetermined temperature T0, indicating that the operating temperature of the operation amplification circuit is within a reasonable range, the temperature control current I_temp provided by the over-current protection unit 1200 is approximately 0, and the output current Iout provided by the output unit 1100 is substantially unaffected by the over-current protection unit 1200; when the operating temperature T is greater than or equal to the predetermined temperature T0, indicating that the operating temperature of the operation amplification circuit 1000 is too high, the over-current protection unit 1200 provides the temperature control current I_temp linearly related to the operating temperature T, wherein the relationship slope is k (as shown in FIG. 3, k is greater than 0), so that the output current Iout provided by the output unit 1100 may be limited such that the operating temperature T is lowered.

Preferably, the predetermined temperature T0 is not higher than 85° C.

It should be noted that the relationship slope k should not be too large, otherwise the operation amplification circuit may be too sensitive to the operating temperature, which will cause the output current to oscillate with the operating temperature and hence lead an unstable output current. Those skilled in the art may set the relationship slope k according to specific conditions such as chip package and heat dissipation environment.

Figure 4A:
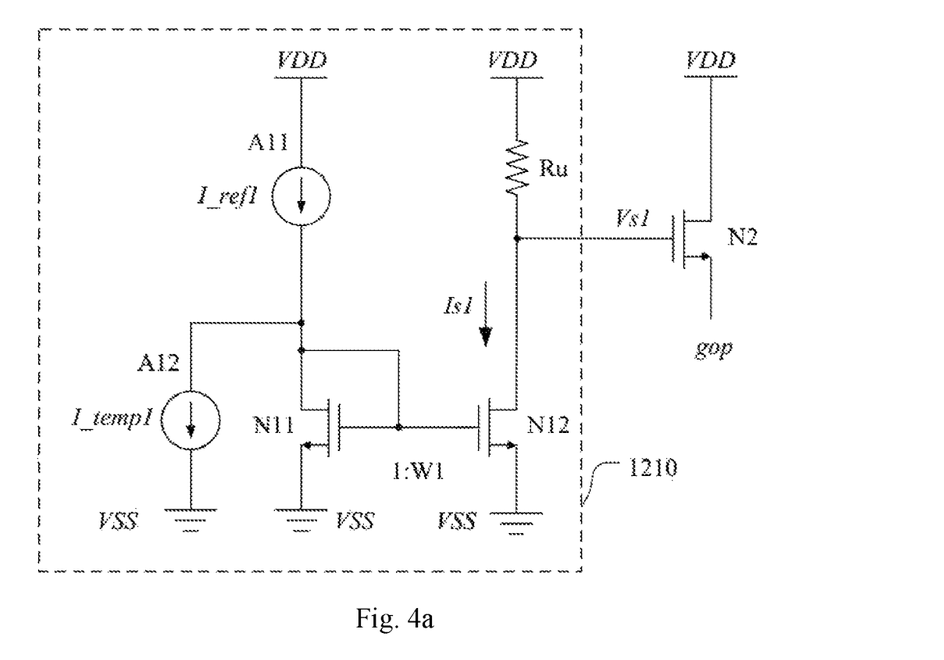
FIGS. 4a and 4b show circuit diagrams of the over-current protection unit of FIG. 2.
Figure 4B:
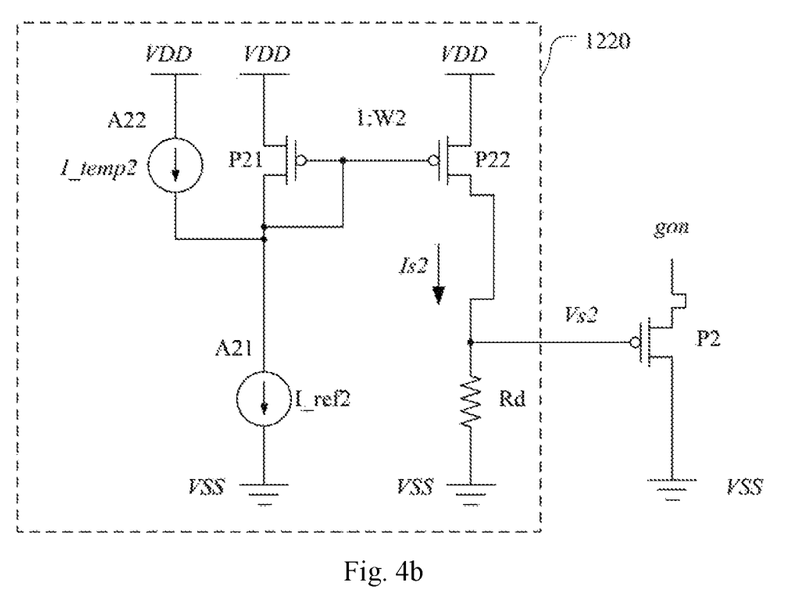

FIGS. 4a and 4b show circuit diagrams of the over-current protection unit of FIG. 2.

As shown in FIGS. 4a and 4b, the over-current protection unit of the first embodiment of the disclosure comprises a third transistor N2, a fourth transistor P2 and a voltage generating module (including a first voltage generating module 1210 and a second voltage generating module 1220). Hereinafter, a specific description will be given by taking an example in which the third transistor N2 is an N-channel field effect transistor and the fourth transistor P2 is a P-channel field effect transistor.

As shown in FIG. 4a, the third transistor N2 and the first voltage generating module 1210 adjust the gate-source voltage Vgs1 of the first transistor P1 by controlling the first control signal gop, thereby limiting the on current of the first transistor P1. Specifically, the third transistor N2 has a first terminal (drain) receiving the high power supply voltage VDD, a second terminal (source) connected to the control terminal of the first transistor P1, and a control terminal (gate) receiving a first sampling voltage Vs1; the first voltage generating module 1210 is configured to generate a first temperature control current I_temp1 according to the operating temperature T, and generate the first sampling voltage Vs1 according to the first temperature control current I_temp1. When the first temperature control current I_temp1 is greater than or equal to the set threshold I0 and the first control signal gop is active, the first sampling voltage Vs1 turns on the third transistor N2 to pull up the first control signal gop, thereby raising the gate-source voltage Vgs1 of the first transistor P1. When the first transistor P1 is turned on by the first control signal gop, a degree of conduction of the first transistor P1 decreases and the output current Iout provided by the first transistor P1 is limited due to the gate-source voltage Vgs1 of the first transistor P1 being raised; while when the first transistor P1 is not turned on by the first control signal gop, the first transistor P1 may remain in an off state.

Specifically, as shown in FIG. 4a, the first voltage generating module 1210 comprises a first resistor Ru and a first current source. The first resistor Ru has a first terminal receiving the high supply voltage VDD, and a second terminal connected to the control terminal of the third transistor N2, so as to provide the first sampling voltage Vs1. The first current source comprises a first reference current source A11, a first temperature control current source A12, and a first current mirror structure formed by transistors N11 and N12. Among them, the first reference current source A11 provides a first reference current I_ref1, and the first temperature control current source A12 provides a first temperature control current I_temp1 according to the operating temperature T; in the first current mirror structure, a ratio in sizes of the transistor N11 to the transistor N12 is 1:W1 (i.e., a scale factor of the first current mirror structure is W1, and W1 is greater than 0), and the transistor N11 receives a difference current between the first reference current I_ref1 and the first temperature control current I_temp1, so that the transistor N12 is capable of providing the first sampling current Is1 flowing through the first resistor Ru, the first sampling current Is1 flows from the first terminal of the first resistor Ru to the second terminal, a voltage drop across the first resistor Ru is: Vru=(I_ref1−I_temp1)·W1·Ru, and the gate-source voltage of the first transistor P1 is: Vgs1=Vru+VgsN2, wherein VgsN2 is the gate-source voltage of the third transistor N2.

When the operating temperature T exceeds the predetermined temperature T0, as the operating temperature T increases, the first temperature control current I_temp1 increases, and the first sampling voltage Vs1 increases, so that when the first control signal gop is active, the pull-up capability of the third transistor N2 is enhanced, the degree of conduction of the first transistor P1 is lowered, and the output current Iout provided by the first transistor P1 is reduced.

Similarly, as shown in FIG. 4b, the fourth transistor P2 and the second voltage generating module 1220 adjust the gate-source voltage Vgs2 of the second transistor N1 by controlling the second control signal gon, thereby limiting the on current of the second transistor N1. Specifically, the fourth transistor P2 has a first terminal (source) receiving the low power supply voltage VSS, a second terminal (drain) connected to the control terminal of the second transistor N1, and a control terminal (gate) of the fourth transistor P2 receives a second sampling voltage Vs2; the second voltage generating module 1220 is configured to generate a second temperature control current I_temp2 according to the operating temperature T, and generate the second sampling voltage Vs2 according to the second temperature control current I_temp2. When the second temperature control current I_temp2 is greater than or equal to the set threshold I0 and the second control signal gon is active, the second sampling voltage Vs2 turns on the fourth transistor P2 to pull up the second control signal gon, thereby raising the gate-source voltage Vgs2 of the second transistor N1. When the second transistor N1 is turned on by the second control signal gon, a degree of conduction of the second transistor N1 decreases and the output current Iout provided by the second transistor N1 is limited due to the gate-source voltage Vgs2 of the second transistor N1 being pulled down; while when the second transistor N1 is not turned on by the second control signal gon, the second transistor N1 may remain in an off state.

Specifically, as shown in FIG. 4b, the second voltage generating module 1220 comprises a second resistor Rd and a second current source. The second resistor Rd has a first terminal receiving the low supply voltage VSS, and a second terminal connected to the control terminal of the fourth transistor P2, so as to provide the second sampling voltage Vs2. The second current source comprises a second reference current source A21, a second temperature control current source A22, and a second current mirror structure formed by transistors P21 and P22. Among them, the second reference current source A21 provides a second reference current I_ref2, and the second temperature control current source A22 provides a second temperature control current I_temp2 according to the operating temperature T; in the second current mirror structure, a ratio in sizes of the transistor P21 to the transistor P22 is 1: W2 (a scale factor of the second current mirror structure is W2, and W2 is greater than 0), and the transistor P21 receives a difference current between the second reference current I_ref2 and the second temperature control current I_temp2, so that the transistor P22 may provide a second sampling current Is2 flowing through the second resistor Rd, the second sampling current Is2 flows from the second terminal of the second resistor Rd to the first terminal, a voltage drop across the second resistor Rd is: Vrd=(I_ref2−I_temp2)·W2·Rd, and the gate-source voltage Vgs2 of the second transistor is: N1=Vrd+VsgP2, wherein VsgP2 refers to the source gate voltage of the fourth transistor P2.

When the operating temperature T exceeds the predetermined temperature T0, as the operating temperature T increases, the second temperature control current I_temp2 increases, and the second sampling voltage Vs2 reduces, so that when the second control signal gon is active, the pull-up capability of the fourth transistor P2 is enhanced, the degree of conduction of the second transistor N1 is lowered, and the output current Iout provided by the second transistor N1 is reduced.

It should be noted that the temperature control current I_temp comprises a first temperature control current I_temp1 and a second temperature control current I_temp2, that is, the first temperature control current I_temp1 and the second temperature control current I_temp2 satisfy the relationship diagram shown in FIG. 3.

Preferably, the first temperature control current I_temp1 is equal to the second temperature control current I_temp2, the first reference current I_ref1 is equal to the second reference current I_ref2, and the scale factor W1 of the first current mirror structure is equal to the scale factor W2 of the second current mirror structure.

Preferably, the transistors N11 and N12 in the first current mirror structure are N-channel field effect transistors, and the transistors P21 and P22 in the second current mirror structure are P-channel field effect transistors. However, embodiments of the present disclosure are not limited thereto.

Further, when the first temperature control current I_temp1 rises to the first reference current I_ref1 and the second temperature control current I_temp2 rises to the second reference current I_ref2, the operating temperature T does not exceed 160° C. When the first temperature control current I_temp1 (or the second temperature control current I_temp2) reaches the set threshold I0, the operating temperature T is about 150° C.

In order to prevent the over-current protection unit 1200 from limiting the output current Iout when the operating temperature T is not high, preferably, the high power supply voltage VDD may be set to be equal to or less than the product of the first reference current I_ref1, the scale factor W1, and a resistance of the first resistor Ru. Thereby, when the operating temperature T is not high, the first transistor P1 may be entirely turned on, and the output current Iout is not limited.

The operation amplification circuit provided by the first embodiment of the disclosure directly obtains the temperature control current according to the operating temperature of the operation amplification circuit, and the over-current protection unit in the operation amplification circuit limits the output current with the temperature control current if and only if the operating temperature exceeds a certain threshold, thereby reducing the power consumption of the operational amplifier, preventing the operating temperature from being too high, affecting the normal operation of the operational amplifier, and avoiding damage to the operational amplifier caused by excessive operating temperature. Meanwhile, when the operating temperature is within a reasonable range, the over-current protection unit in the operation amplification circuit does not limit the output current, thereby ensuring the output efficiency, and driving capability of the operation amplification circuit under normal operating temperature.

Figure 5:
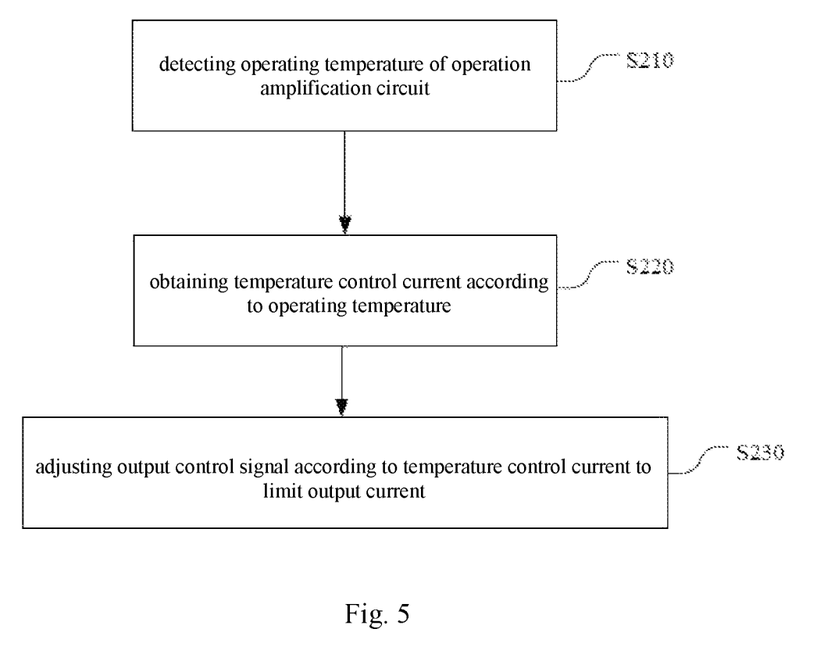
FIG. 5 illustrates a flow chart of an over-current protection method for an operation amplification circuit of a second embodiment of the disclosure.

FIG. 5 illustrates a flow chart of an over-current protection method for an operation amplification circuit of a second embodiment of the disclosure, including steps S210 through S230.

The operation amplification circuit comprises a control unit and an output unit. The control unit is implemented, for example, by an operational amplifier, wherein the operational amplifier generates an output control signal according the input signal and the output signal, and the output unit generates an output current according to the output control signal and accumulates or discharges the charge under control the output current Iout to generate an output signal.

Specifically, the output control signal typically comprises a first control signal gop and a second control signal gon; the output unit comprises a first transistor having a P channel and a second transistor having an N channel which are sequentially connected in series between a high power supply voltage and a low power supply voltage. The first transistor and the second transistor are respectively controlled by the first control signal and the second control signal, and the first transistor or the second transistor is turned on to generate the output current Iout.

Step S210: detecting an operating temperature of the operation amplification circuit.

Step 220: obtaining a temperature control current I_temp according to the operating temperature T, wherein when the operating temperature T is greater than or equal to a predetermined temperature T0, the temperature control current I_temp is positively correlated with the operating temperature T; preferably, setting the temperature control current I_temp to be approximately 0 when the operating temperature T is less than or equal to the predetermined temperature T0; setting the temperature control current I_temp to be linearly related to the operating temperature T when the working temperature T is greater than or equal to the predetermined temperature T0.

Step S230: adjusting the output control signal according to the temperature control current I_temp to limit the output current Iout; specifically, generating a first sampling voltage and a second sampling voltage according to the temperature control current I_temp; providing a pull-up path (e.g., implemented by the third transistor connected between the high power supply voltage and the control terminal of the first transistor) at a control terminal of the first transistor, wherein when the temperature control current I_temp is greater than or equal to a set threshold I0 and the first control signal is active, the first sampling voltage turns on the pull-up path; and providing a pull-down path (e.g., implemented by the fourth transistor connected between the low power supply voltage and the control terminal of the second transistor) at the control terminal of the second transistor, wherein when the temperature control current I_temp is greater than or equal to the set threshold I0 and the second control signal is active, the second sampling voltage turns on the pull-down path.

As a specific embodiment, the temperature control current I_temp comprises a first temperature control current I_temp1 and a second temperature control current I_temp2, and the step of generating a first sampling voltage and a second sampling voltage according to the temperature control current comprises: providing a first reference current I_ref1 and a second reference current I_ref2; converting a difference current between the first reference current I_ref1 and the first temperature control current I_temp1 into the first sampling current according to a first scale factor W1 (e.g., implemented by the first current mirror structure), and converting a difference current between the second reference current I_ref2 and the second temperature control current I_temp2 into the second sampling current according to a second scale factor W2 (e.g., implemented by the second current mirror structure); and providing the first sampling voltage and the second sampling voltage according to the first sampling current and the second sampling current, respectively. Preferably, the first temperature control current I_temp1 is equal to the second temperature control current I_temp2, the first reference current I_ref1 is equal to the second reference current I_ref2, and the first scale factor W1 is equal to the second scale factor W2.

In a preferred embodiment, the predetermined temperature T0 is not higher than 85° C., and when the first temperature control current I_temp1 is equal to the first reference current I_ref1 and the second temperature control current I_temp2 is equal to the second reference current I_ref2, the operating temperature T does not exceed 160° C.

In summary, the operation amplification circuit and the over-current protection method therefor provided by each embodiment of the disclosure directly obtain the temperature control current according to the operating temperature of the operation amplification circuit, and the over-current protection unit in the operation amplification circuit limits the output current with the temperature control current if and only if the operating temperature exceeds a certain threshold, thereby reducing the power consumption of the operational amplifier, preventing the operating temperature from being too high, affecting the normal operation of the operational amplifier, and avoiding damage to the operational amplifier caused by excessive operating temperature. Meanwhile, when the operating temperature is within a reasonable range, the over-current protection unit in the operation amplification circuit does not limit the output current, thereby ensuring the output efficiency, and driving capability of the operation amplification circuit under normal operating temperature.

It is to be explained that the relationship terms, such as "first" and "second", are used herein only for distinguishing one entity or operation from another entity or operation but do not necessarily require or imply that there exists any actual relationship or sequence of this sort between these entities or operations. Furthermore, terms "comprising", "including" or any other variants are intended to cover the non-exclusive including, thereby making that the process, method, merchandise or device comprising a series of elements comprise not only those elements but also other elements that are not listed explicitly or the inherent elements to the process, method, merchandise or device. In the case of no more limitations, the element limited by the sentence "comprising a . . . " does not exclude that there exists another same element in the process, method, merchandise or device comprising the element.

The embodiments in accordance with the present disclosure, as described above, are not described in detail, and are not intended to limit the present disclosure to be only the described particular embodiments. Obviously, many modifications and variations are possible in light of the above. These embodiments has been chosen and described in detail by the specification to explain the principles and embodiments of the present disclosure so that those skilled in the art can make good use of the present disclosure and the modified use based on the present disclosure. The disclosure is to be limited only by the scope of the appended claims and the appended claims and equivalents thereof.

What is claimed is:

1. An operation amplification circuit, comprising:
    a control unit, configured to generate an output control signal according to an input signal and an output signal;
    an output unit, configured to generate an output current under control of the output control signal, wherein the output unit comprises an output capacitor which is charged or discharged by the output current in order to generate the output signal;
    an over-current protection unit, configured to obtain a temperature control current according to an operating temperature of the operation amplification circuit, wherein when the operating temperature is greater than or equal to a predetermined temperature, the temperature control current is positively correlated with the operating temperature, and the over-current protection unit is configured to adjust the output control signal according to the temperature control current in order to limit the output current.

2. The operation amplification circuit according to claim 1, wherein the control unit comprises an operational amplifier; a first input terminal and a second input terminal of the operational amplifier respectively receive the input signal and the output signal, and an output terminal of the operational amplifier provides the output control signal.

3. The operation amplification circuit according to claim 1, wherein
when the operating temperature is less than or equal to the predetermined temperature, the temperature control current is approximately 0,
when the operating temperature is greater than or equal to the predetermined temperature, the temperature control current is linear with the operating temperature.

4. The operation amplification circuit according to claim 3, wherein the output control signal comprises a first control signal and a second control signal,
the output unit further comprises a first transistor having a P channel and a second transistor having an N channel which are sequentially connected in series between a high power supply voltage and a low power supply voltage, the first transistor and the second transistor are respectively controlled by the first control signal and the second control signal, and the first transistor or the second transistor is turned on to generate the output current.

5. The operation amplification circuit according to claim 4, wherein the over-current protection unit comprises:
a third transistor, having a first terminal receiving the high power supply voltage, a second terminal connected to the control terminal of the first transistor, and a control terminal receiving a first sampling voltage;
a fourth transistor, having a first terminal receiving the low power supply voltage, a second terminal connected to the control terminal of the second transistor, and a control terminal receiving a second sampling voltage; and
a voltage generating module, generating the first sampling voltage and the second sampling voltage according to the temperature control current,
when the temperature control current is greater than or equal to a set threshold and the first control signal is active, the third transistor is turned on by the first sampling voltage, and when the temperature control current is greater than or equal to the set threshold and the second control signal is active, the fourth transistor is turned on by the second sampling voltage.

6. The operation amplification circuit according to claim 5, wherein the temperature control current comprises a first temperature control current and a second temperature control current, and the voltage generating module comprises:
a first current source, providing the first temperature control current according to the operating temperature, and converting a difference current between a first reference current and the first temperature control current into the first sampling current by a current mirror structure;
a second current source, providing the second temperature control current according to the operating temperature, and converting a difference current between a second reference current and the second temperature control current into the second sampling current by a current mirror structure;
a first resistor, providing the first sampling voltage at the control terminal of the third transistor according to the first sampling current; and
a second resistor, providing the second sampling voltage at the control terminal of the fourth transistor according to the second sampling current.

7. The operation amplification circuit according to claim 6, wherein
the third transistor comprises an N-channel field effect transistor, and a first terminal of the first resistor receives the high power supply voltage; a second terminal of the first resistor is connected to the control terminal of the third transistor, and the first sampling current flows from the first terminal of the first resistor to the second terminal;
the fourth transistor comprises a P-channel field effect transistor, and a first terminal of the second resistor receives the low power supply voltage; a second terminal of the second resistor is connected to the control terminal of the fourth transistor, and the first sampling current flows from the second terminal of the second resistor to the first terminal.

8. The operation amplification circuit according to claim 7, wherein
the first temperature control current is equal to the second temperature control current, and the first reference current is equal to the second reference current,
the current mirror structure in the first current source has an equal scale factor with the current mirror structure in the second current source.

9. The operation amplification circuit according to claim 8, wherein
the high power supply voltage is less than or equal to a product of the first temperature control current, the scale factor, and a resistance of the first resistor.

10. An over-current protection method for an operation amplification circuit, the operation amplification circuit comprising a control unit and an output unit, the control unit generating an output control signal according to an input signal and an output signal, the output unit generating an output current according to the output control signal and accumulates or releases a charge under control of the output current to generate the output signal, wherein the method comprises:
detecting an operating temperature of the operation amplification circuit;
obtaining a temperature control current according to the operating temperature, wherein when the operating temperature is greater than or equal to a predetermined temperature, the temperature control current is positively correlated with the operating temperature; and
adjusting the output control signal according to the temperature control current to limit the output current.

11. The over-current protection method according to claim 10, wherein
setting the temperature control current to be approximately 0 when the operating temperature is less than or equal to the predetermined temperature,
setting the temperature control current to be linear with the operating temperature when the operating temperature is greater than or equal to the predetermined temperature.

12. The over-current protection method according to claim 10, wherein the output control signal comprises a first control signal and a second control signal, the output unit comprises a first transistor having a P channel and a second transistor having an N channel which are sequentially connected in series between a high power supply voltage and a low power supply voltage, the first transistor and the second transistor are respectively controlled by the first control signal and the second control signal, and the first transistor or the second transistor is turned on to generate the output current.

13. The over-current protection method according to claim 12, wherein the method of adjusting the output control signal according to the temperature control current to limit the output current comprises:

generating a first sampling voltage and a second sampling voltage according to the temperature control current;

providing a pull-up path at a control terminal of the first transistor, wherein when the temperature control current is greater than or equal to a set threshold and the first control signal is active, the first sampling voltage turns on the pull-up path; and providing a pull-down path at a control terminal of the second transistor, wherein when the temperature control current is greater than or equal to the set threshold and the second control signal is active, the second sampling voltage turns on the pull-down path.

14. The over-current protection method according to claim 13, wherein the temperature control current comprises a first temperature control current and a second temperature control current, the step of generating a first sampling voltage and a second sampling voltage according to the temperature control current comprises:

providing a first reference current and a second reference current;

converting a difference current between the first reference current and the first temperature control current into the first sampling current according to a first scale factor, and converting a difference current between the second reference current and the second temperature control current into the second sampling current according to a second scale factor; and providing the first sampling voltage and the second sampling voltage according to the first sampling current and the second sampling current, respectively.

15. The over-current protection method according to claim 14, wherein the first temperature control current is equal to the second temperature control current, the first reference current is equal to the second reference current, and the first scale factor is equal to the second scale factor.

* * * * *